United States Patent [19]

Nakamura

[11] Patent Number: 5,886,918
[45] Date of Patent: Mar. 23, 1999

[54] SEMICONDUCTOR INTEGRATED CIRCUIT DEVICE HAVING SYNCHRONOUS FUNCTION WITH A PLURALITY OF EXTERNAL CLOCKS

[75] Inventor: Masayuki Nakamura, Ome, Japan

[73] Assignee: Hitachi, Ltd., Tokyo, Japan

[21] Appl. No.: 123,005

[22] Filed: Jul. 27, 1998

Related U.S. Application Data

[62] Division of Ser. No. 714,465, Sep. 16, 1996, Pat. No. 5,835,445.

[60] Provisional application No. 60/010,072 Jan. 30, 1996.

[51] Int. Cl.[6] ..................................................... G11C 7/00
[52] U.S. Cl. ............................................. 365/63; 365/200
[58] Field of Search ............................... 365/63, 200, 52, 365/189.07

[56] References Cited

U.S. PATENT DOCUMENTS 5,327,390 7/1994 Takasugi .
5,384,737 1/1995 Childs et al. .
5,402,389 3/1995 Flannagan et al. .
5,426,333 6/1995 Maeda .
5,677,887 10/1997 Ishibashi et al. ........................ 365/63

OTHER PUBLICATIONS

Hitachi, HM5216800 Series, HM5416800 Series, Jan. 18, 1993.
Motorola Inc., *Memories,* 1991, pp. 7–32 through 7–36 and 7–100 through 7–107.

*Primary Examiner*—Vu A. Le
*Attorney, Agent, or Firm*—Haynes and Boone, LLP

[57] ABSTRACT

The present invention is a method and apparatus for reducing the effects of transmission line impedance on the clock signal in a semiconductor device. In a departure from the prior art, the present invention includes multiple clock inputs, located near the device's synchronous input/output ports, reducing the maximum distance that any single internal clock signal must travel and thereby reducing the amount of delay caused by the effects of transmission line impedance on the internal clock signals. The present invention also includes a read only memory ("ROM") to improve the speed of the device and to provide additional space in the highly congested areas between the column decoder and address ports of the device. The ROM is programmed to decipher row address for information that would be beneficial in a redundant column access.

8 Claims, 7 Drawing Sheets

SEMICONDUCTOR INTEGRATED CIRCUIT DEVICE HAVING SYNCHRONOUS FUNCTION WITH A PLURALITY OF EXTERNAL CLOCKS

This application is a divisional of U.S. application No. 08/714,465, U.S. Pat. No. 5,835,445 filed on Sep. 16, 1996, which claims the benefit of U.S. provisional application No. 60/010,072 filed on Jan. 30, 1996.

BACKGROUND OF THE INVENTION

The present invention relates generally to semiconductor design technology, and more particularly to a method and apparatus for synchronization of the multiple input/output of a semiconductor device.

Speed and timing constraints have always been important considerations in designing electronic systems. Most system designs must match the timing requirements of all the components used, yet still be optimized for high speed. As a result, many integrated circuits, or "chips," utilize a synchronous design. A synchronous chip is one in which components of the chip are connected to a common system clock. Synchronous chips also have latches or registers connected to inputs and outputs, all on a single monolithic chip. For example, U.S. Pat. No. 5,426,333 to Maeda describes a synchronous dynamic random access memory chip. Synchronous chips provide many benefits to system designers, such as fewer external logic chips and high speed operation. However, synchronous chips also present several design difficulties for chip designers.

One such design difficulty is the routing of the clock signal throughout the chip. Due to the effects of transmission line impedance, the clock signal as seen on one side of the chip is typically delayed from the same clock signal, as seen on the opposite side of the chip. This problem is exacerbated by increased chip size and an increased number of input/output ("I/O") ports. For example, a 256 mega-bit ("Mbit") dynamic random access memory ("DRAM") is very large in size, and can have as many as 16 I/O ports on a single chip.

SUMMARY OF THE INVENTION

The present invention provides a method and apparatus for solving various problems associated with synchronous devices. In order to explain the benefits of the present invention, an intermediate-level design will first be discussed with regards to FIGS. 1, 2, and 3. FIG. 1 is a block diagram of a 256 Mbit synchronous DRAM device. FIG. 2 is a schematic diagram of an I/O section of the DRAM device and FIG. 3 is a timing diagram of the I/O section. The present invention, which serves as a further improvement on the intermediate-level design of FIGS. 1–3, will be summarized thereafter.

Referring to FIG. 1, a 256 Mbit synchronous DRAM device is designated generally by a reference numeral 10. The device 10 comprises four arrays 12–15, each of which comprises 64 megabits of memory, a plurality of external terminals including I/O ports DQ0–DQ7 and DQ8–DQ15, a clock ("CLK") input for receiving a CLK signal, and additional address and control ports designated generally by reference numeral 16.

FIG. 2 shows how the CLK signal is used to control I/O registers attached to the 16 I/O ports DQ0–DQ15. Each of the 16 I/O ports DQ0–DQ15 has associated therewith a register REG0–REG15 and a logic gate AND0–AND15, respectively. The CLK signal is routed to each of the logic gates AND0–AND15 by a transmission line INT. The impedance of the transmission line INT is represented by a series of resistors R and capacitors C. The points of the transmission line INT that serve as inputs to each of the logic gates AND0–AND15 are designated as INT(0)–INT(15), respectively.

The CLK signal is also used to generate a data output enable ("DOE") signal via a controller 19. The logic gates AND0–AND15 logically combine the DOE signal with the CLK signal to produce register clocks C(0)–C(15), respectively. In this way, the CLK and DOE signals simultaneously control the timing of the output of internal signals DAT0–DAT15 to the I/O ports DQ0–DQ15, respectively. However, due to the impedance of the transmission line INT on the CLK signal, the internal signals DAT0–DAT15 are not simultaneously output, as shown below.

FIG. 3 shows a timing diagram for a read operation of the device 10 (FIG. 2). The access time for the entire device 10 is measured from the time the CLK signal rises, at point P1, until the last of the I/O ports DQ0–DQ15 has valid output data. In the device 10, an output data Q0 is the last valid data. This is because the CLK signal's propagation delay, measured from the CLK input (FIG. 2) to the point INT(0), is the longest delay due to the impedance of the transmission line INT. A delay tRC0 represents the difference in the CLK signal as seen at the CLK input and the point INT(0). The delay tRC0 is greater than a delay tRC7, which represents the difference in the CLK signal as seen at the CLK input and the point INT(7), because the transmission line effect is less pronounced the closer the point INT(0)–INT(15) is to the CLK input. As a result, the transmission line INT slows the access time of the device 10, as shown by the delays tRC0 and tRC7, due to the high effective impedance on the I/O port farthest from the CLK input. As can be seen by this intermediate-level design, what is needed is a way to reduce the effects of transmission line impedance on the CLK signal so that the speed and accuracy of the device 10 is improved.

Another design difficulty that hinders high speed performance and increases the size of the chip is the extra circuitry required for implementing column redundancy. Column redundancy is well know in the art and simply enables a column of bits that contains a defect to be replaced by another, redundant, column of bits. For example, referring again to FIG. 1, each of the arrays 12–15 contain a plurality of bits, arranged in columns like columns C1 and CR of the array 12. The CR column is a redundant column and remains unused if there are no defects in any other column. However, if a column has a defect, like a defective bit B1 of column C1, then the column C1 is disabled and the redundant column CR is enabled so that the redundant column CR "repairs" the column C1. Information allowing the redundant column CR to repair the column C1 is stored in a redundancy decoder circuit 17.

In operation, the device 10 receives row and column signals (not shown) from the address and control ports 16. The row signals are received first and stored in a row address buffer ("RAB") 18a, where they are used to address individual rows of bits. The column signals are received next, and stored in a column address buffer ("CAB") 18b, where they are used to address the individual columns of bits, such as the column C1. The column signals are then driven to the redundancy decoder circuit 17, where they are checked to see if the addressed row and column is a repaired column. From there, the column signals are driven to a group of column decoders CD1 and CD2 through a bus 17a and 17b, respectively. The time for the column address signals to go from the address and control ports 16 to the column decoders CD1 and CD2 directly affects the speed of the device 10.

Therefore, the CAB 18*b* and redundancy decoder circuit 17 are located directly between the address and control ports 16 and the column decoders CD1 and CD2, thereby minimizing the distance the column signals have to travel and increasing the speed of the device 10.

As a result, the area between the address and control ports 16 and the column decoders CD1 and CD2 is very crowded. As can be seen by this intermediate-level design, what is needed is a reduction in the number or size of the circuits that lie between the address and control ports 16 and the column decoders CD1 and CD2 to shorten the distance that the column signals must travel and ease design difficulties for such a crowded area. Furthermore, any reduction in the number or size of the circuits between the address and control ports 16 and the column decoders CD1 and CD2 would have a direct impact on the speed of the device 10.

The present invention, accordingly, is a method and apparatus for reducing the effects of transmission line impedance on the clock signal in a semiconductor device, as shown by the intermediate-level design of FIGS. 1–3. In a departure from the prior art and an improvement of the intermediate-level design of FIGS. 1–3, the present invention includes multiple clock inputs, located near the device's synchronous I/O ports of the device, reducing the maximum distance that any single internal clock signal must travel, which in turn reduces the amount of delay caused by the transmission line impedance of the internal clock signal.

In a second implementation, the device includes a read only memory ("ROM") programmed to decipher row addresses for information that would be beneficial in performing redundant column accesses to improve the speed of the device and to provide additional space in the highly congested areas between the column decoder and address ports of the device.

A technical advantage achieved with the present invention is that the reduction in the effects of the transmission line impedance on the clock signal achieved therewith improves the speed of an integrated circuit.

Another technical advantage achieved with the present invention is that it improves the accuracy of the integrated circuit by reducing the variance of the clock signal on individual components.

Another technical advantage achieved with the present invention is that it enables the I/Os of the integrated circuit to operate at different frequencies.

Another technical advantage achieved with the present invention is that it improves the setup and hold times for the data inputs by reducing the variance of the clock signal on individual components.

Another technical advantage achieved with the present invention is that it results in the access path between the address ports and the column decoder being less crowded.

Another technical advantage achieved with the present invention is that the use of the ROM improves the speed of a repaired device by reducing the distance between the address and control ports.

Another technical advantage achieved with the present invention is that the use of the ROM improves the speed of a repaired device by performing some column redundancy calculations in a row address cycle preceding the column address cycle.

DETAILED DESCRIPTION OF THE PREFERRED EMBODIMENT

As described above, FIGS. 1, 2 and 3 respectively show synchronous 256 Mbit dynamic random access memory ("SDRAM") device with 16 I/Os.

Figure 4:
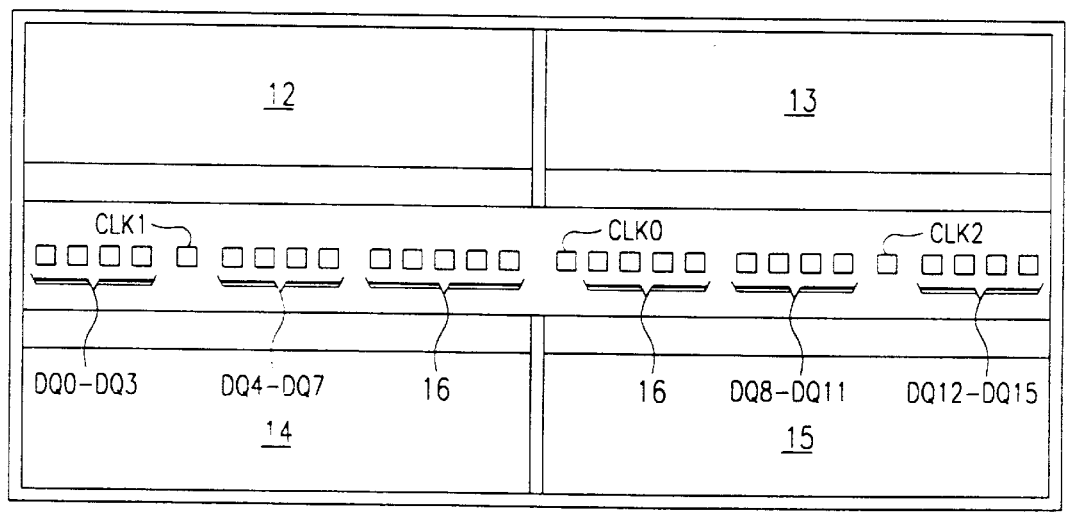
FIG. 4 is a block diagram of a synchronous DRAM embodying the features of the present invention.

In FIG. 4, the reference numeral 20 designates a synchronous memory device embodying features of the present invention. While in a preferred embodiment of the invention, the device 20 is a 256 Mbit SDRAM, it should be understood that the present invention is not limited to use with a SDRAM, but may be used in conjunction with any integrated circuit device comprising multiple ports controlled by a single clock or control signal, including programmable array logic and other types of random access memories.

The device 20 is an improvement of the device 10 (FIG. 1); therefore, the circuits and signals of the device 20 that are identical to those of the device 10 will be designated by the same reference name or numeral, and any changed, modified or improved circuits and signals will be designated by a new name or numeral. The device 20 includes four arrays 12–15, each comprising 16 megabits of memory, a plurality of I/O ports DQ0–DQ7 and DQ8–DQ15, three clock inputs for receiving three clock signals CLK0, CLK1 and CLK2, and additional ports referenced generally by reference numeral 16.

Figure 5:
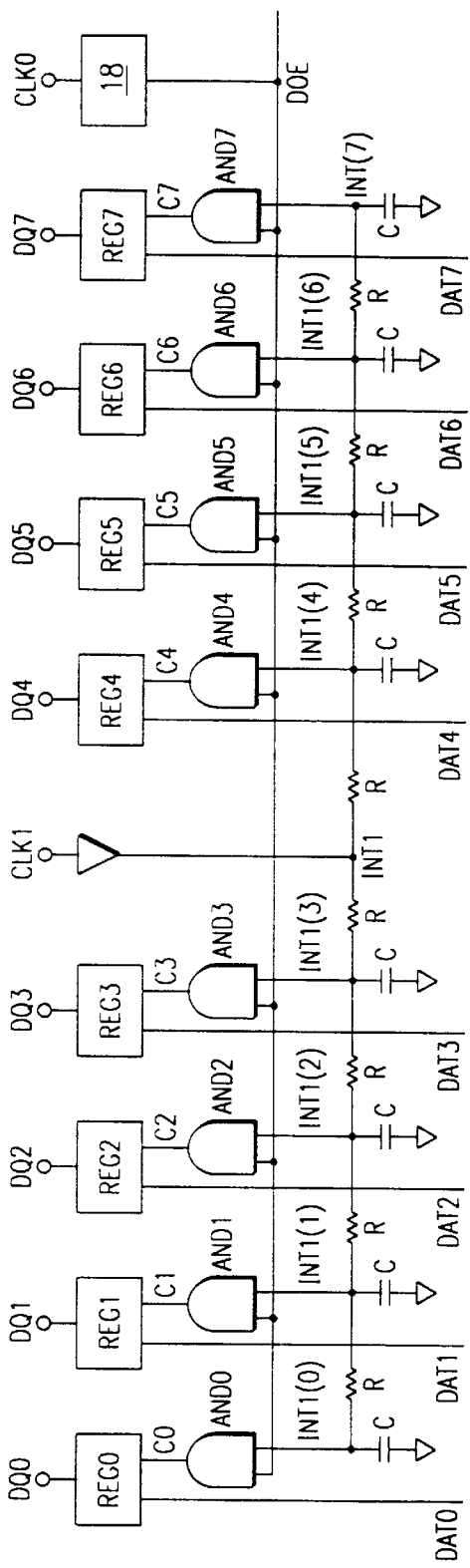
FIG. 5 is a schematic diagram of a first implementation of an I/O section of the DRAM of FIG. 4.

Referring to FIG. 5, each of the 16 I/O ports DQ0–DQ15 has associated therewith an I/O buffer (not shown) comprising a register REG0–REG15 and a logic gate AND0–AND15, respectively, to produce register clocks C(0)–C(15) for the internal signals DAT0–DAT15, respectively. Although only the first eight I/O ports, logic gates, registers, register clocks and internal signals are shown in FIG. 5, the latter eight I/O ports, logic gates, registers, register clocks and internal signals function in a similar manner, and are omitted for ease of description. Furthermore, the invention works equally well with different numbers of I/Os, such as 24 and 32 I/Os, and may therefore be extended for many similar devices.

The CLK0 signal is used to create the output enable signal DOE via the controller 19. The CLK1 signal is input to each of the logic gates AND0–AND7 via a transmission line INT1. The impedance of the transmission line INT1 is represented by a series of resistors R and capacitors C. Points of the transmission line INT1 that serve as inputs to each of the logic gates AND0–AND7 are designated as INT1(0)–INT1(7), respectively. Although not shown, in a similar manner, a second transmission line, a second group of logic gates and a second group of registers are associated with I/O ports DQ8–DQ15. In this way, the CLK1 and DOE signals simultaneously control the timing of the output of the internal signals DAT0–DAT7 on the ports DQ0–DQ7, respectively, and the CLK2 and DOE signals simultaneously control the timing of the output of the internal signals DAT8–DAT15 on the ports DQ8–DQ15, respectively. Although the CLK1 and CLK2 signals are affected by their associated transmission line loads, the impact on the speed of the device 20 is greatly reduced compared with the device 10 (FIG. 3), as shown below.

Figure 6:
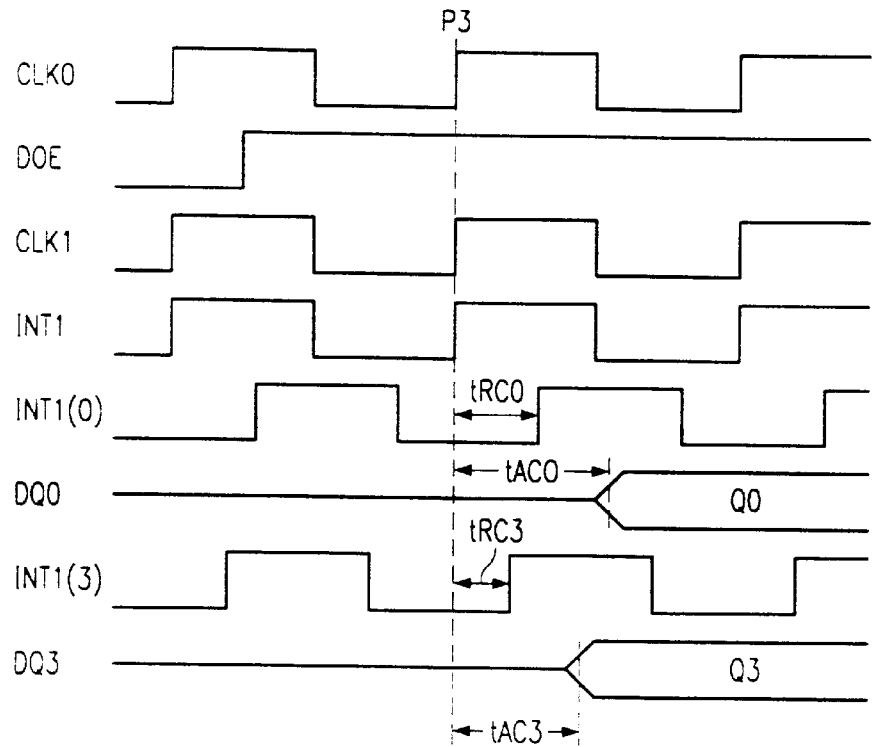
FIG. 6 is a timing diagram of the I/O section of FIG. 5.

Referring to FIG. 6, an access time for the entire device 20 is measured from the time the CLK0 signal rises, at point P3, until the last I/O port DQ0–DQ14 has valid data. In the improved circuit of FIG. 5, a transmission line delay tRC0, representing the propagation time for the CLK1 signal to travel from the CLK1 input to the point INT1(0), is slightly greater than a transmission line delay tRC3, representing the propagation time for the CLK1 signal to travel from the CLK1 input to the point INT1(3). As a result, the last I/O port DQ0–DQ15 to have valid data is still I/O port DQ0 so that the access time for the entire device 20 is determined by an access time tAC0 of the I/O port DQ0. This is because the transmission line impedance at INT1(0) is more than the transmission line impedance at INT1(3). However, the difference between the slowest access time tAC0 and a fastest access time tAC3, is very small. This is because the greatest distance between the CLK1 input and the farthest transmission line point INT1(0) is reduced by one half that of the transmission line point INT(0) of FIG. 2.

Figure 7:
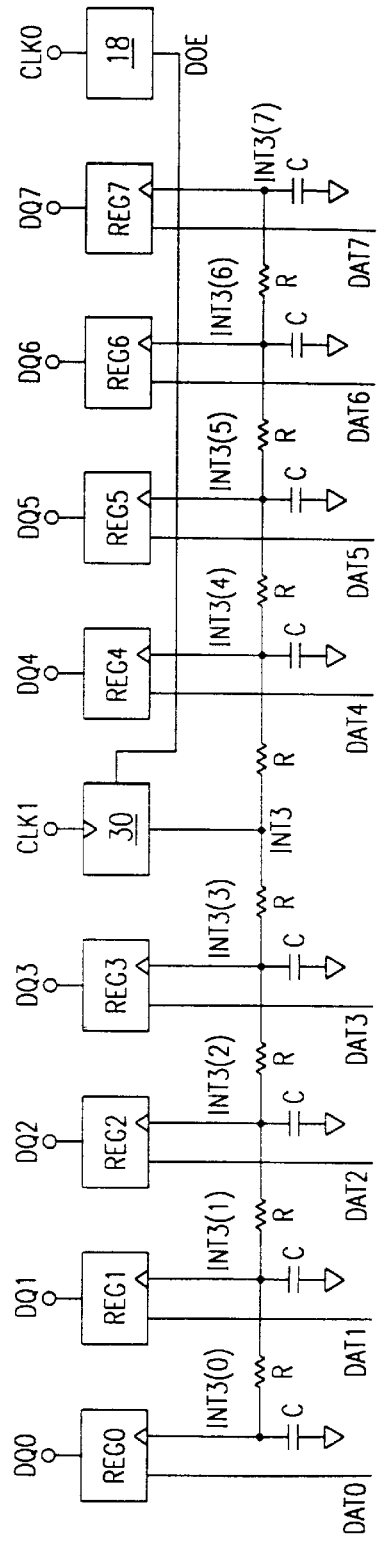
FIG. 7 is a schematic diagram of a second implementation of an I/O section of the DRAM of FIG. 4.

FIG. 7 illustrates an alternate implementation of the present invention that employs fewer circuits. In particular, the implementation shown in FIG. 7 is similar to that shown in FIG. 5, in that each of the 16 I/O ports DQ0–DQ15 has associated therewith a register REG0–REG15, respectively, for the internal signals DAT0–DAT15. However, instead of the DOE signal being an input to logic gates AND0–AND15, it serves as an enable input to an input buffer 30 for the CLK1 signal and an input buffer (not shown) for the CLK2 signal (not shown). The input buffer 30 drives a transmission line INT3, which is similar to the transmission line INT1 of FIG. 5. The impedance of the transmission line INT3 is represented by a series of resistors R and capacitors C. Points of the transmission line INT3 that serve as inputs to each of the registers REG0–REG7 are designated as INT3(0)–INT3(7), respectively.

Figure 8:
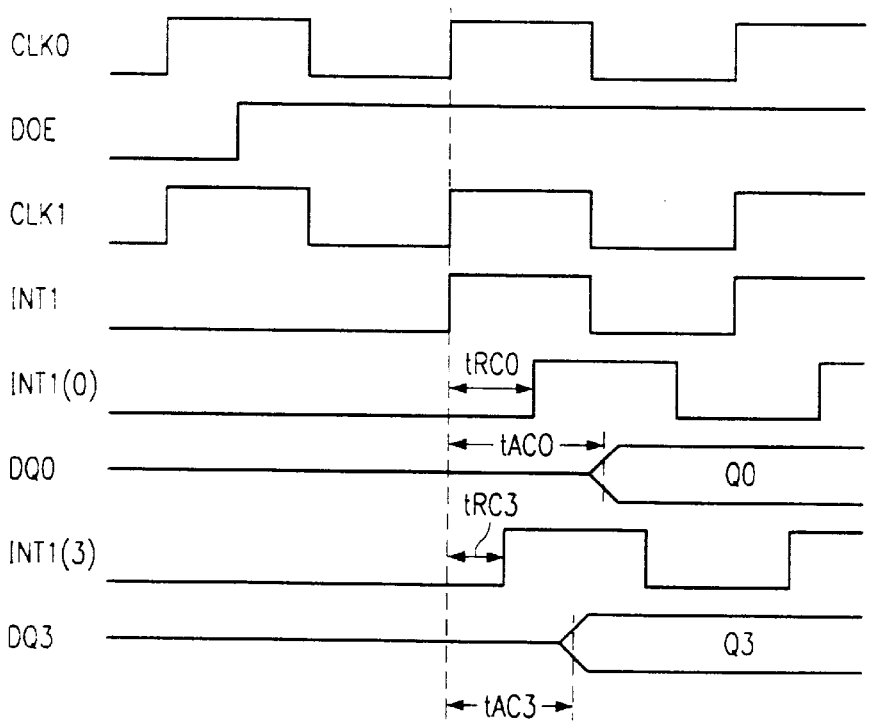
FIG. 8 is a timing diagram of the I/O section of FIG. 7.

Referring to FIG. 8, it can be seen that the timing diagram for the implementation shown in FIG. 7 is similar to the timing diagram of FIG. 6 for the implementation shown in FIG. 5. Furthermore, any propagation delays caused by the additional input buffer 30 are compensated by the removal of the logic gates AND0–AND7.

Figure 1:
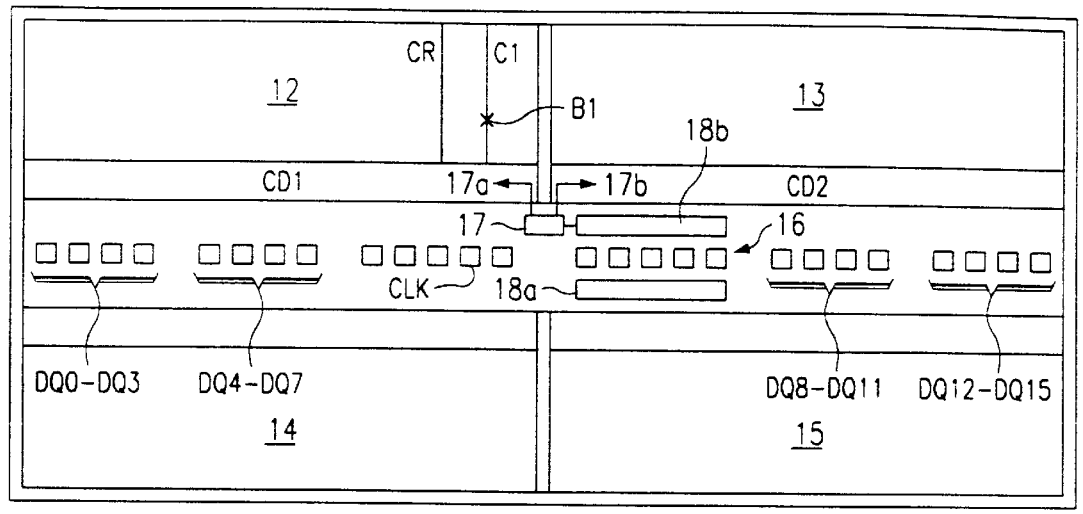
FIG. 1 is a block diagram of a synchronous DRAM illustrating problems to be addressed in the DRAM of FIG. 4.
Figure 2:
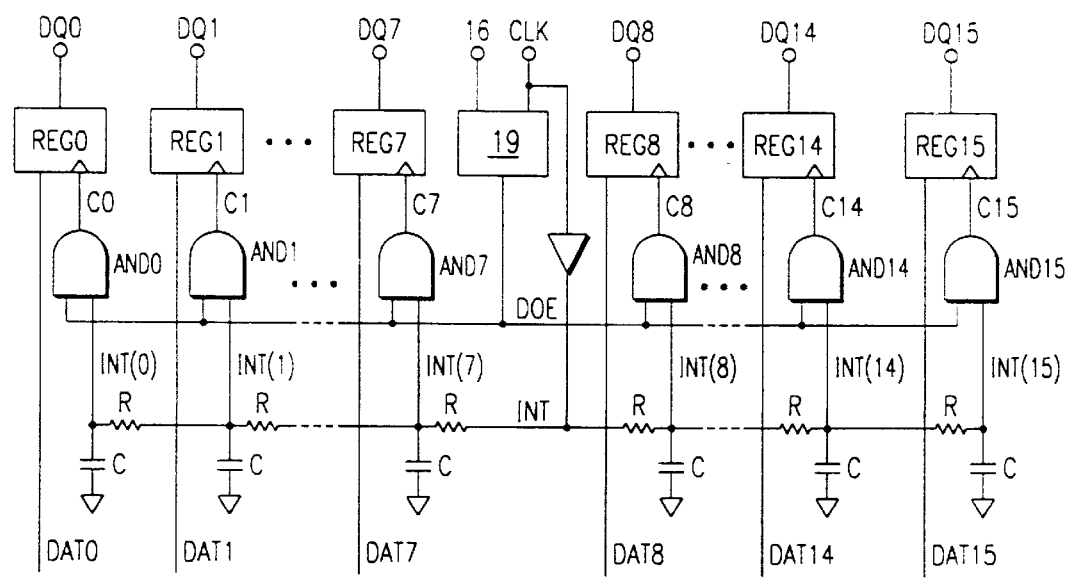
FIG. 2 is a schematic diagram of a I/O section of the DRAM of FIG. 1.
Figure 3:
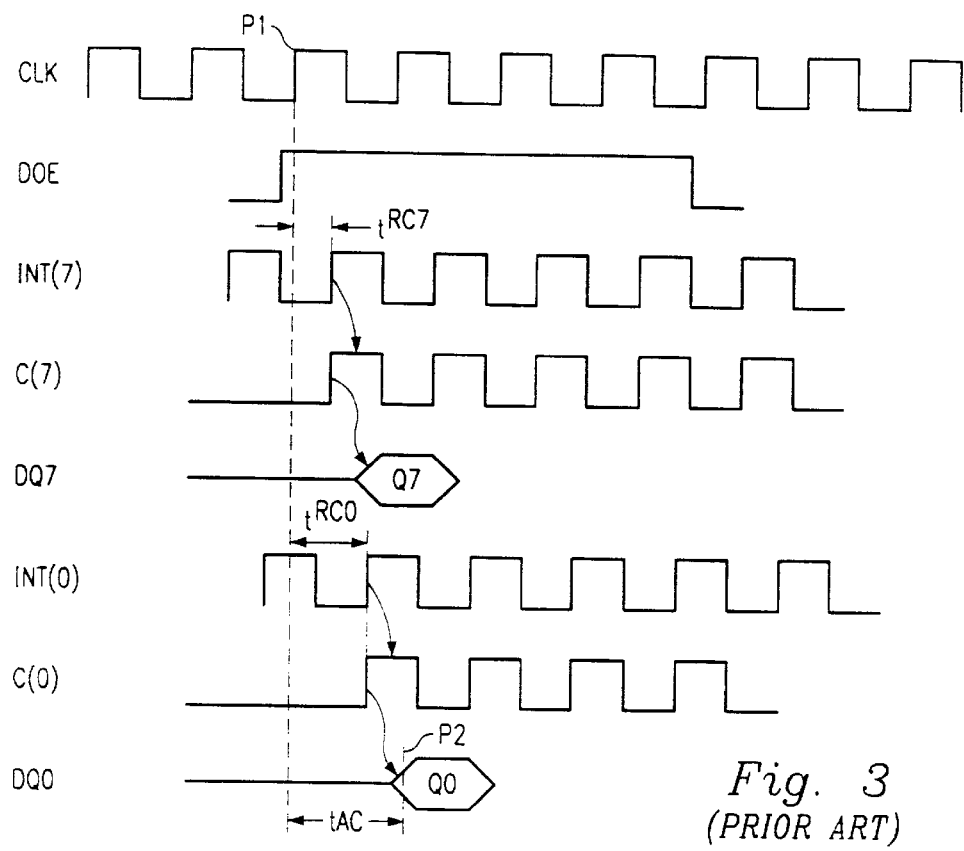
FIG. 3 is a timing diagram of the I/O section of FIG. 2.
Figure 9:
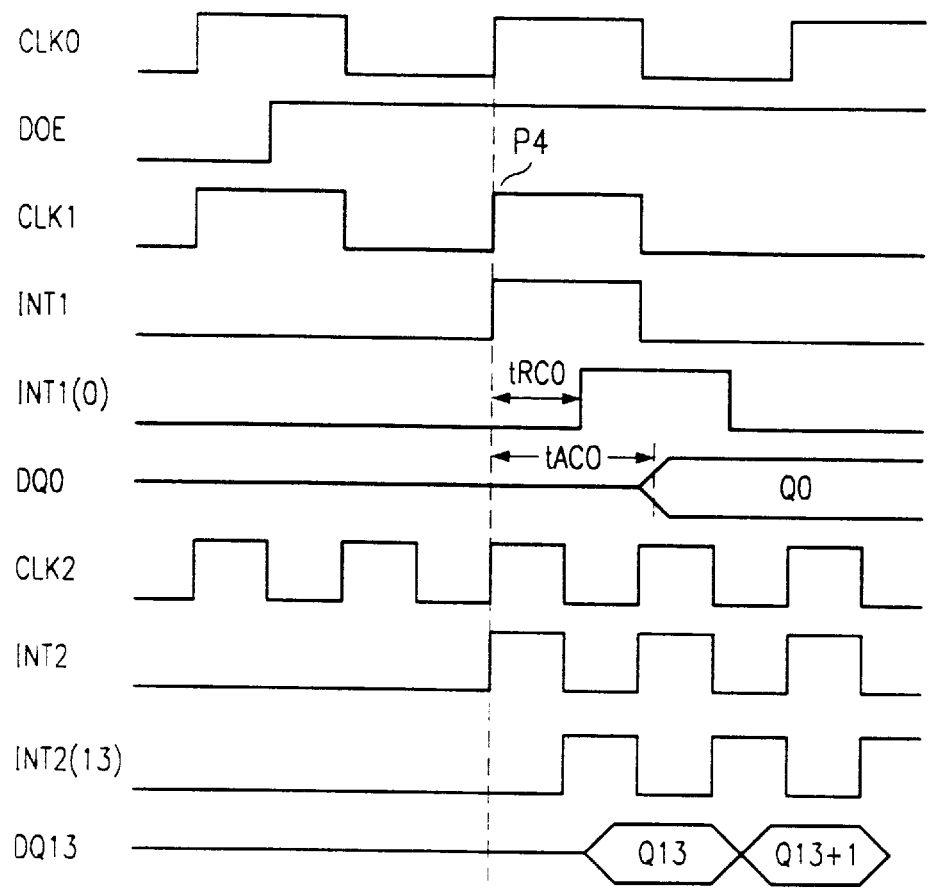
FIG. 9 is a timing diagram illustrating a technical advantage of the circuits of FIGS. 5 and 7.

Referring again to FIGS. 5 and 7, both implementations of the invention have technical advantages over the SDRAMs of FIGS. 1–3. One advantage is that by having the two additional clock signals CLK1 and CLK2, a system designer has the ability to run the two clocks at different frequencies. As shown in FIG. 9, this would provide the system designer with the ability to advance only one byte of data. For example, in a burst operation that requires only the upper byte to advance, a burst address counter (not shown) would advance the address of the SDRAM 20. The CLK2 signal would transition with the burst counter, but the CLK1 would only transition once, at point P4. In this way, the I/O ports DQ0–DQ7 (represented in FIG. 9 by I/O port DQ0) would remain stable while the I/O ports DQ8–DQ15 (represented in FIG. 9 by I/O port DQ13) would advance with the burst counter.

Figure 10:
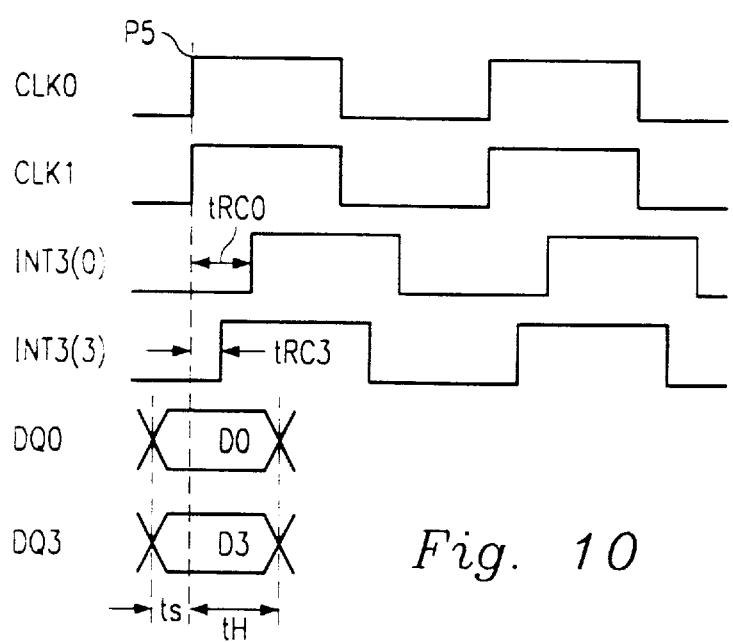
FIG. 10 is a timing diagram illustrating another technical advantage of the circuits of FIGS. 5 and 7.

Referring to FIG. 10, another advantage of the present invention is in connection with setup and hold timings during a write operation. Specifically, during a synchronous write operation, input data D0–D15 must be provided on the I/O ports DQ0–DQ15 for a discrete setup time tS and hold time tH before and after, respectively, a rise of the CLK0 signal, at point P5. Considering the examples of I/O port DQ0 and I/O port DQ3, the data D0 and D3 are received into the registers REG0 and REG3, respectively. Furthermore, the clocking of the register REG0 is delayed from the rise of the CLK0 signal P5 by the delay tRC0 and the clocking of the register REG3 is delayed from the rise of the CLK0 signal P5 by the delay tRC3. However, in the present invention, the difference between the longest delay tRC0 and the shortest delay tRC3 is minimal. As a result, the setup times tS and hold times tH can be tightened, thereby giving system designers of the device 20 a smaller window during which the data D0–D15 must remain valid.

Figure 11:
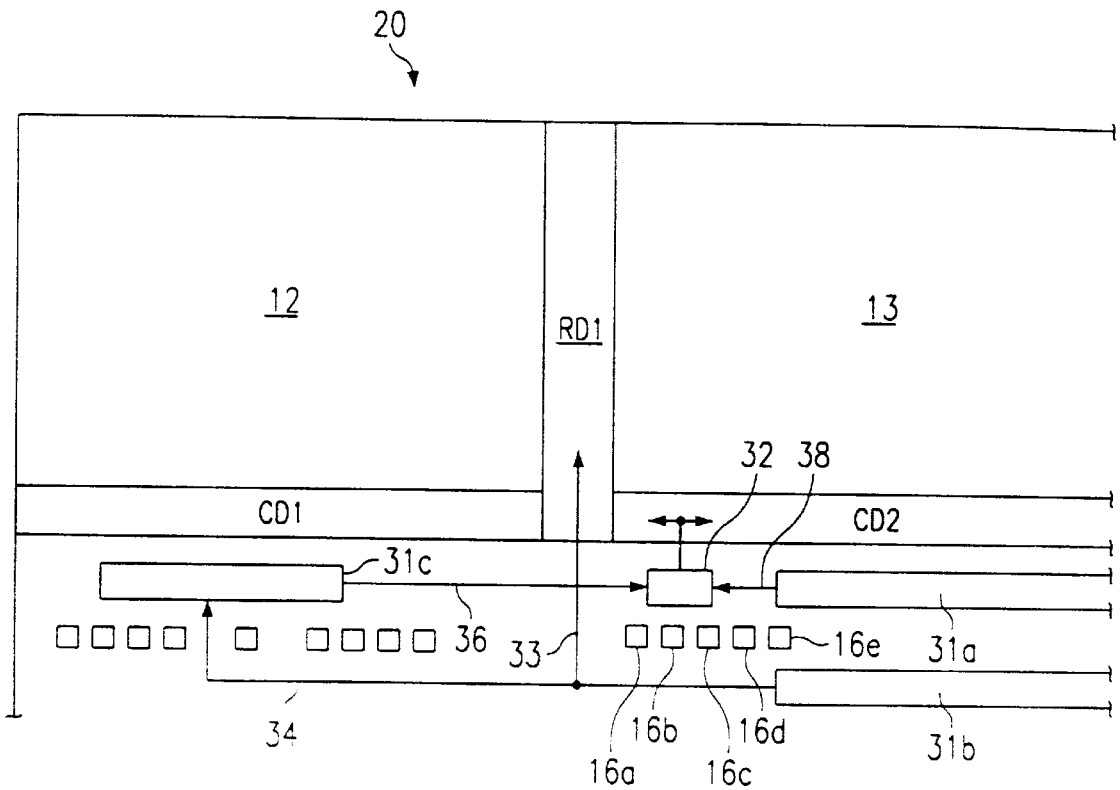
FIG. 11 is a block diagram of another portion of the DRAM of FIG. 4.

Referring to FIG. 11, a portion of the device 20 is expanded, showing a column address buffer ("CAB") 31a, a row address buffer ("RAB") 31b, a read only memory ("ROM") 31c, a column redundant detect ("CRD") circuit 32, two column decoder areas CD1, CD2, and a row decoder area RD1. Furthermore, the additional ports 16 include a row address select port 16a, a column address select port 16b and a plurality of address ports, including address ports 16c and 16d. The address buffers CAB 31a, RAB 31b, the decoder areas CD1, CD2, RD and the additional ports 16a–16d are all conventional designs.

The above-mentioned components of device 20 are especially beneficial during an operation when column redundancy has been incorporated. Although column redundancy is well known in the art, utilizing column redundancy adds constraints to both the speed of the device as well as the size of the device.

The speed and size of the device 20 is improved through use of the ROM 31c and the CRD circuit 32. The ROM 31c includes circuitry that links a row address (not shown) to a repaired column. The ROM 31c can be implemented in many ways, such as an assortment of fuses.

Figure 12:
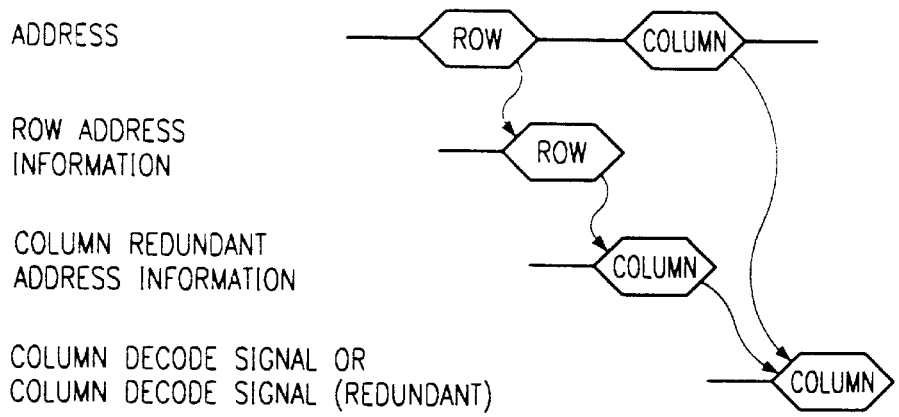
FIG. 12 is a timing diagram of the DRAM portion of FIG. 11.

Referring also to FIG. 12, during operation, a row address is first received by the device 20. The row address is transmitted into the RAB 31b, where it is driven to the row decoder area RD via a conventional row address bus 33. The row address is also driven to the ROM 31c on a second row bus 34, where it is used to access information on whether the present memory operation is to a redundant address. The ROM 31c drives column redundant address information along a bus 36 into the CRD circuit 32. Upon completion, a column address is received into the column address buffer CAB 31a. The column address is then driven into the CRD circuit 32 along a column address bus 38. The CRD circuit 32 then utilizes the column redundant address information from the ROM 31c and the column address from the CAB 31a to determine the correct column address to send to the column decoders CD1, CD2.

In addition, because the ROM 31c pre-performs some of the column redundancy work for the CRD circuit 32, the ROM does not have to be located in any particular area. The CRD circuit 32 and the CAB 31a are located near the address ports 16c, 16d and the column decoders CD1, CD2 so that the propagation delay from the address ports to the column decoders is minimal. As a result, this area is very crowded. But because the ROM 31c works off of the row address, which is received a cycle earlier, it can be located in a distant area without any penalty to speed. Therefore, because a portion of the work to be done in checking column redundancy is performed by the ROM 31c beforehand and the ROM is located in an uncrowded portion of the device 20, the CRD circuit 32 is smaller and faster, thereby making the device faster. Furthermore, a circuit, such as the row decoder driver 40, and/or a portion of a signal line, such as the portion of row address line 33 crossing bus 36, can be located in an area between the ROM 31c and the CRD circuit 32.

Figure 13:
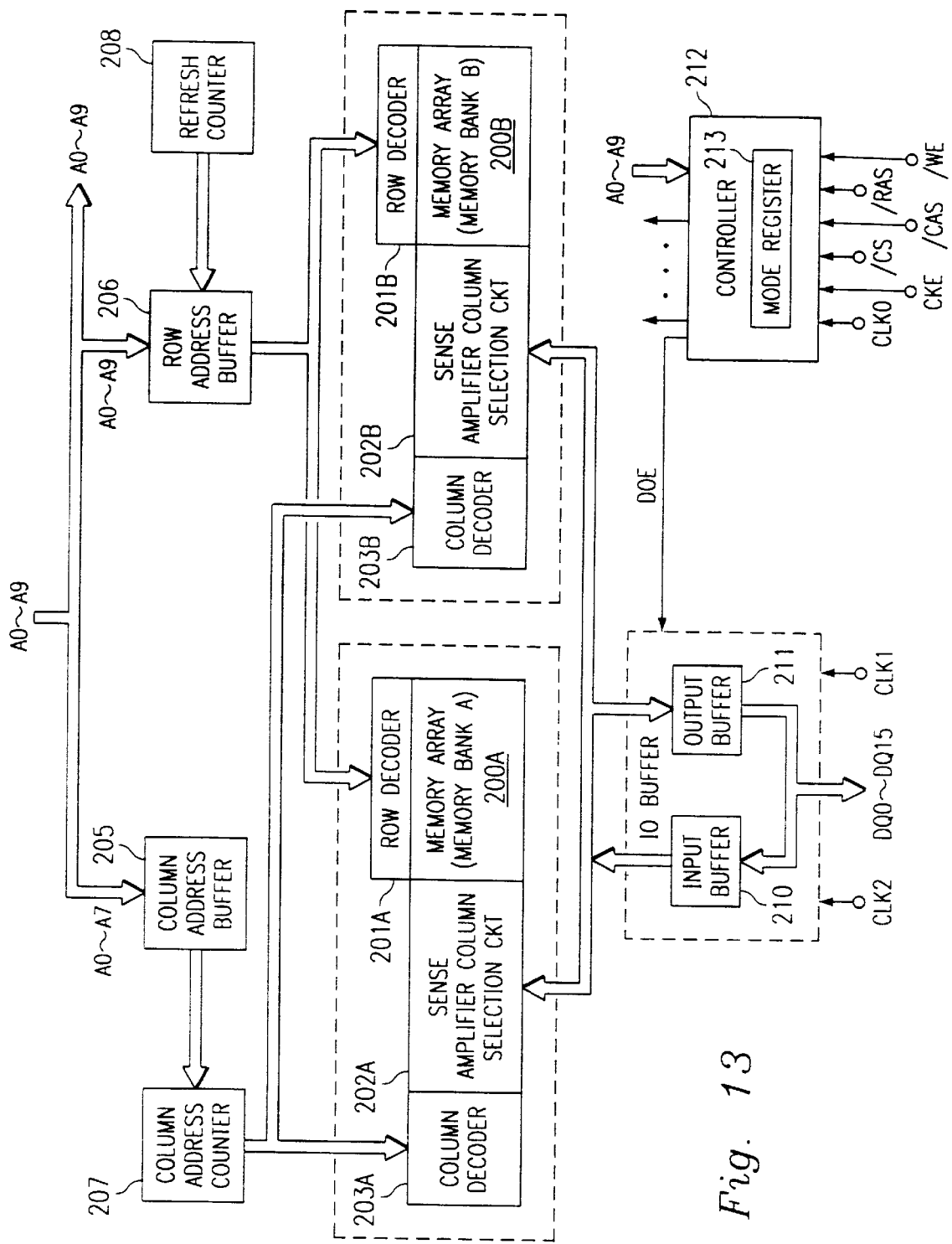
FIG. 13 is a functional block diagram of a synchronous DRAM featuring embodiments of the circuits of FIGS. 5 and 7.

FIG. 13 is a block diagram illustrating a SDRAM embodying the output circuits in FIGS. 5 and 7. The SDRAM of this embodiment comprises a memory array 200A comprising a memory bank A and a memory array 200B comprising a memory bank B. The memory arrays 200A and 200B are each equipped with dynamic memory cells. Although not shown, selection terminals of the dynamic memory cells are arranged in rows and columns such that all the memory cells in the same column are coupled to a word line for each column. Furthermore, data input/output terminals of the memory cells arranged in the same row are connected to complementary data lines for each row.

In operation, memory cells are selected be choosing an appropriate column and row. To select one memory cell, one of the word lines of the memory array 200A is energized to a selection level according to the result of decoding row address signals by a row decoder 201A. The complementary data lines associated with the selected memory cell of the memory array 200A are coupled to a sense amplifier and column selection circuit 202A. A column decoder 203A decodes column address from a column address counter 207 and provides the decoded column addresses to column switching circuits of the sense amplifier and column selection circuit 202A. In response, the column switching circuits enable certain ones of the complementary data lines to be supplied to sense amplifier circuits of the sense amplifier and column selection circuit 202A. The sense amplifier circuits detect very small potential difference appearing on the selected data lines and amplify the potential difference accordingly.

Similarly, the memory array 200B is provided with a row decoder 201B, a sense amplifier, a column selection circuit 202B and a column decoder 203B. The common complementary data lines 204 are connected to the output terminals of an input buffer 211. The input terminals of the input buffer 210 and the output terminals of the output buffer 211 are connected to sixteen data I/O terminals DQ0 to DQ15.

The row address signals and column address signals are fed to address input terminals A0 to A9 and are received by a column address buffer 205 and a row address buffer 206 in an address multiplex form. The address signals that are fed are held by the respective buffers. In a refresh operation mode, the row address buffer 206 receives, as a row address signal, a refresh address signal output from a refresh counter 208. The output of the column address buffer 205 is fed as preset data of the column address counter 207. The column address counter 207 sequentially increases the column address signals according to a predefined operation mode, discussed in greater detail below. The column address counter 207 then provides column address signals to the column decoders 203A, 203B.

A controller 212 receives external control signals such as a clock signal CLK0, a clock enable signal CKE, a chip select signal /CS, a column address strobe signal /CAS, a row address strobe signal /RAS, and write enable signal /WE, as well as control data from address input terminals A0–A9. For the sake of convention, signal names that are proceeded by a "/" are negative signals, i.e., they are asserted at a "low" voltage level, and the remaining signals are positive signals, i.e., they are asserted at a "high" voltage level. Although illustrated in a central location, an external terminal receiving the clock signal CLK0 is located in a central portion of a semiconductor chip, and external terminals receiving the clock signals CLK1 and CLK2 are located relatively far from the central portion of the semiconductor chip. Based upon changes in the levels of signals and timings from these signals, the controller 212 forms an internal timing signal for controlling the operation mode of the SDRAM and the operation of the above-mentioned circuit blocks. For this purpose, the controller 212 is provided with a control logic (not shown) and a mode register 213.

As described earlier, the clock signal CLK0 is used as a master clock signal of the SDRAM, and the other external signals are used in synchronism with the rising edge of the clock signal CLK0. When the chip select signal /CS is asserted, the SDRAM is enabled and the /CS signal initiates the start of a command input cycle. When the chip select signal /CS is not asserted, the SDRAM is disabled, the remaining external inputs are ignored. Here, however, the state of selecting the memory bank that will be described later and internal operation such as the burst operation, are not affected by a change into the enable/disable state of the SDRAM. The signals such as /RAS, /CAS and /WE have functions different from the corresponding signals in a conventional, non-synchronous DRAM, and serve as significant signals in the conventional DRAM, and serve as significant signals for defining the command cycle that will be described later.

The clock enable signal CKE designates the validity of the next clock signal; i.e., the rising edge of the next clock signal CLK0 is validated when the clock enable signal CKE is at the high level and is ineffective when it is at the low level. Moreover, during a read operation, the controller 212 also receives an external control signal which controls the output enable for the output buffer 211. When the external control signal is, for example, at the high level, the output buffer 211 is changed to a high-output-impedance state according to the DOE signal.

The row address signal is defined by the address signals from the A0–A8 terminals that are received during a row address strobe bank active command cycle that will be described later and that is in synchronism with the rising edge of the clock signal CLK0.

The address signal from the address input terminal A9 is regarded as a bank selection signal in the above-mentioned row address strobe bank active command cycle. That is, the memory bank A is selected when the input of A9 is at the low level, and the memory bank B is selected when it is at the high level. Selection of the memory bank can be controlled by activating only the row decoder on the selected memory bank side, by selecting none of the column switching circuits on the non-selected memory bank side, or by making connection to the input buffer 210 and to the output buffer 211 only on the selected memory bank side.

During a precharge command cycle, defined in greater detail below, the address signal from the address input terminal A8 designates the mode of precharge operation for the complementary data lines; i.e., when the A8 signal is at the high level, the objects to be precharged are the two memory banks and when the A8 signal is at the low level, neither of the memory banks should be precharged.

During a column address read command or column address write command, discussed in greater detail below, the column address signal is defined by the levels of address signals from the address input terminals A0 to A7 that is in synchronism with the rising edge of the clock signal CLK0. As a result, the defined column address is used as a start address for the burst access.

Major operation modes in the SDRAM designated by commands will be described below.

(1) Mode Register Set Command

This command defines and presets the mode register 213. The command is designated by /CS, /RAS, /CAS, /WE=low level, and the data (register set data) to be set is given via A0 to A9. Although there is no particular limitation, the register set data may be a burst length, a CAS latency, or a write mode. Though there is no particular limitation, the burst length that can be set is 1, 2, 4, 8 or full-page (256), the CAS latency that can be set is 1, 2 or 3, and the write mode that can be set to a burst write or a single write.

In the read operation designated by a column address read command that will be described later, the CAS latency designates how many cycles of internal clock signals are to be taken from the fall of /CAS to the output operation of the output buffer 211. The internal operation time for reading the data is necessary before the read data is defined, and is set according to the frequency of the internal clock signals. In other words, the CAS latency is set to a relatively large value when internal clock signals of a high frequency are used and is set to a relatively small value when internal clock signals of a low frequency are used.

(2) Row Address Strobe Bank Active Command

This command effects the designation of row address strobe and the selection of a memory bank, and is designated by /CS, /RAS=low level, and /CAS, /WE=high level. In this operation, the signals received in A0 to A8 are row address signals, and the signal received at A9 is a memory bank selection signal. The reception of the signals is carried out in synchronism with the rising edge of the internal clock signals as described above. For example, when this command is designated, a word line in a memory bank designated by this command is selected, and a memory cell connected to the word line is electrically connected to the corresponding complementary data lines.

(3) Column Address Read Command

This command initiates a burst read operation and effects a column address strobe, and is designated by /CS, /CAS=low level and /RAS, /WE=high level. In this operation, the signals received at A0 to A7 are column address signals. The column address signals are fed to the column address counter 207 as a burst start address. In the burst read operation designated thereby, a memory bank and a word line therein have been selected in the preceding row address strobe bank active command cycle. Therefore, the memory cells of the selected word line are successively selected and are consecutively read out according to address signals output from the column address counter 207 in synchronism with the internal clock signals. The number of data consecutively read out is equal to the number designated by the burst length. Reading the data from the output buffer 211 is started after having waited for a number of cycles of internal clock signals defined by the CAS latency.

(4) Column Address Write Command

This command initiates a burst write operation, provided a burst write command is set in the mode register 213, or a single write operation, provided a single write command is set in the mode register. The command further defines that the column address strobe for either the single write or the burst write operation. The command is designated by /CS, /CAS, /WE=low level and /RAS=high level. At this moment, the address fed to A0–A7 is received as a column address signal. In the burst write operation, the column address signal serves as a burst start address for the column address counter 207. The burst write operation designated thereby is carried out in the same procedure as that of the burst read operation. In the write operation, however, there is no CAS latency, and reception of write data is started from the column address write command cycle.

(5) Precharge Command

This command starts a precharging operation for a memory bank that is selected by A8 and A9, and is designed by /CS, /RAS, /WE=low level and /CAS=high level.

(6) Automatic Refresh Command

This command starts an automatic refreshing operation, and is designated by /CS, /RAS, /CAS=low level and /WE, CKE=high level.

(7) Burst Stop in Full-Page Command

This command halts the full-page burst, but is disregarded during a burst operation other than for full-page. This command is designated by /CS, /WE=low level and /RAS, /CAS=high level.

(8) No-Operation Command

This command designates that no operation is substantially carried out, and is designated by /CS=low level and /RAS, CAS, /WE=high level.

In the SDRAM of FIG. 13, when one memory bank performs a burst operation, the other memory bank is ignored during the operation. Therefore, when the row address strobe bank active command is received, the row address operation is carried out in the one memory bank without affecting the operation in the other memory bank. For example, the SDRAM has means for holding the data, addresses and control signals received from the external ports. The addresses and control signals are stored for each memory bank. The data of one word line in a memory block selected by the row address strobe bank active command are latched by a latch circuit (not shown) in order to execute the read operation prior to the column operation. Therefore, it is possible to start the internal operation beforehand by issuing a precharge command and a row address strobe bank active command to the memory bank which is different from the memory bank in which a command is not finished and is being executed.

Read/Write operations of the SDRAM are controlled in synchronism with the clock signal CLK0. Furthermore, the SDRAM can receive and output data, in synchronism with the clock signal CLK0 and hence it is capable of operating as a memory having a capacity as large as a DRAM at a speed as fast as that of a static random access memory. By designating how much data can be accessed for a word line that is selected using a burst length, the SDRAM successively changes over the state of selecting the columns using an incorporated column address counter 207, enabling a plurality of data to be successively read out or written.

Although illustrative embodiments of the present invention have been shown and described, a latitude of modification, change and substitution is intended in the foregoing disclosure, and in certain instances, some features of the invention will be employed without a corresponding use of other features. For example, any control signal may also benefit from the features of this invention. Furthermore, additional buffers, drivers, delay circuits and other circuits may be added to the illustrative embodiment without altering the scope of the invention. Accordingly, it is appropriate that the appended claims be construed broadly and in a manner consistent with the scope of the invention.

What is claimed is:

1. An address multiplexed semiconductor memory device comprising:

a plurality of external address terminals for receiving row address signals during a first time period and column address signals during a second time period;

a defect address storing circuit for receiving said row address signals and outputting a plurality of defect address signals; and a comparing circuit for receiving said plurality of defect address signals and said column address signals and deciding whether or not said plurality of defect address signals are coincident with said column address signals, wherein a first distance between an address input region in which said plurality of external address terminals are located and said comparing circuit is shorter than the second distance between said address input region and said defect address storing circuit so that said defect address storing circuit is isolated from said comparing circuit.

2. An address multiplexed semiconductor memory device according to claim 1, wherein a region between said comparing circuit and said defect address storing circuit is used for forming a cross wiring, said cross-wiring being coupled between said comparing circuit and said defect address storing circuit.

3. An address multiplexed semiconductor memory device according to claim 2, wherein said region is used for forming a circuit which is controlled by said row address signals.

4. A semiconductor memory device whose addresses are multiplexed, comprising:

a plurality of external address terminals for receiving row address signals on the first timing and column address signals on the second timing;

a defect address storage circuit which outputs defect address signals according to said row address signals; and a comparing circuit to determine whether said defect address signals match said column address signals, wherein said comparing circuit is located in a central portion of a semiconductor chip, and said defect address storage circuit is located at a distance from said central portion of said semiconductor chip.

5. A semiconductor memory device according to claim 4, a first portion of said plurality of external address terminals is adjacent to an area in which said comparison circuit is located.

6. A semiconductor memory device according to claim 5, said defect address storage circuit is located in a peripheral portion of said semiconductor chip.

7. A semiconductor memory device according to claim 6, wherein a first distance between an address input region in which said plurality of external address terminals are located and said comparing circuit is shorter than the second distance between said address input region and said defect address storing circuit.

8. A semiconductor memory device according to claim 6, wherein a region between said comparing circuit and said defect address storing circuit is used for forming a circuit which is controlled by said row address signals.

* * * * *